(12) United States Patent
Grohn

(10) Patent No.: US 6,876,651 B1
(45) Date of Patent: Apr. 5, 2005

(54) CASCADED PARALLEL PHASE LOCKED LOOPS

(75) Inventor: Ossi Ilari Grohn, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 1140 days.

(21) Appl. No.: 09/666,446

(22) Filed: Sep. 21, 2000

(51) Int. Cl.[7] .............................................. H04Q 11/00
(52) U.S. Cl. ...................................................... 370/375
(58) Field of Search ................................. 370/375, 350, 370/535, 537, 538, 539, 540, 541, 543, 503, 518, 522, 524, 527; 375/219, 356, 360, 371; 455/260; 331/117 R, 113 R, 132, 167, 172, 25, 45

(56) References Cited

U.S. PATENT DOCUMENTS 5,696,800 A * 12/1997 Berger ......................... 375/361
6,317,008 B1 * 11/2001 Gabara .................... 331/117 R

* cited by examiner

*Primary Examiner*—Dang Ton
(74) *Attorney, Agent, or Firm*—Coats & Bennett, P.L.L.C.

(57) ABSTRACT

A parallel cascaded set of transceivers using phase locked loops comprises a PCM communication link therebetween. At a first transceiver station, a primary framer receives an incoming signal. The primary framer extracts a payload signal and a clock signal and splits both. One clock signal is directed to the phase locked loop and the other clock signal is directed to a downstream transceiver. In this manner, start up delay and error introduction are reduced.

22 Claims, 4 Drawing Sheets

CASCADED PARALLEL PHASE LOCKED LOOPS

BACKGROUND OF THE INVENTION

The present invention is directed to improving start up times in a system having a plurality of phase locked loops and more particularly to a system having a plurality of cascaded transceivers, each transceiver having a phase locked loop.

Many wireless communication systems include cascaded cellular base stations and/or radio heads connected by a Pulse Code Modulation (PCM) link, such as a T1 or E1 line. These high speed, high bandwidth lines do not include a clock line, but are still sometimes used to provide reference signals for phase locked loops within the base stations and radio heads. Phase locked loops are used, in general, to perform a wide variety of tasks, such as frequency synthesis, AM and FM detection, frequency multiplication, tone decoding, pulse synchronization of signals from noisy sources, and regeneration of clean signals, particularly in the wireless communication industry.

Where there are a plurality of base stations or radio heads on one PCM link, it has been common for a framer within the base station or radio head to receive the signal from the PCM link, extract a clock signal for use by the phase locked loop of the base station or radio head and also extract a payload signal. The payload signal is shifted and passed to a secondary framer. The phase locked loop then generates a new clock signal that is passed to the secondary framer. The secondary framer transmits over the PCM link to the downstream base stations or radio heads.

This arrangement results in a relatively long start up time, as the first phase locked loop must receive the clock signal, begin to phase lock, and settle before sending a viable signal to the secondary framer for subsequent transmission to the downstream base stations or radio heads. The phase locked loop in the second radio head or base station repeats the process, and so do the other phase locked loops, each adding start up and settling time before the subsequent base stations or radio heads can be used as intended. Further, each additional phase locked loop introduces error into the timing of the clock signal, which may impact performance of downstream base stations and radio heads.

It should be noted that while the situation described above is most common to base stations and radio heads in wireless communication systems, it is also true of other serially cascaded phase locked loops.

BRIEF SUMMARY OF THE INVENTION

The present invention comprises a plurality of base stations or radio heads each having a first framer that receives an incoming signal from a Pulse Code Modulation (PCM) or other communication link. The framer provides two outputs, a clock and a payload, each of which is split. The first clock output is directed to a phase locked loop in the base station or radio head for signal generation in a transmitter. The second clock output is directed to a second framer. The payload signal is initially directed to a time switch, which extracts the payload, splits the signal, and performs any desired shifting. The first payload output directed from the time switch to the transmitter for broadcast through the base station or radio head, while the second payload output is directed from the time switch to the second framer. The second framer combines the clock signal and the payload signal for transmission to downstream base stations and radio heads.

DETAILED DESCRIPTION OF THE INVENTION

The present invention is directed to an improvement on cascaded base stations or radio heads using a clock signal derived from a Pulse Code Modulated (PCM) link, however, an understanding of an entire communications system may be helpful for a proper understanding of the context of the present invention. While the following discussion is couched in terms of a TIA/EIA-136 communication system, it should be appreciated that the present invention is equally applicable to Digital Advance Mobile Phone Service (D-AMPS), European Total Access Communication System (ETACS), Code Division Multiple Access (CDMA), Global System for Mobile Communication (GSM), Pacific Digital Cellular (PDC), and the like, the standards and documentation of which are herein incorporated by reference.

Figure 1:
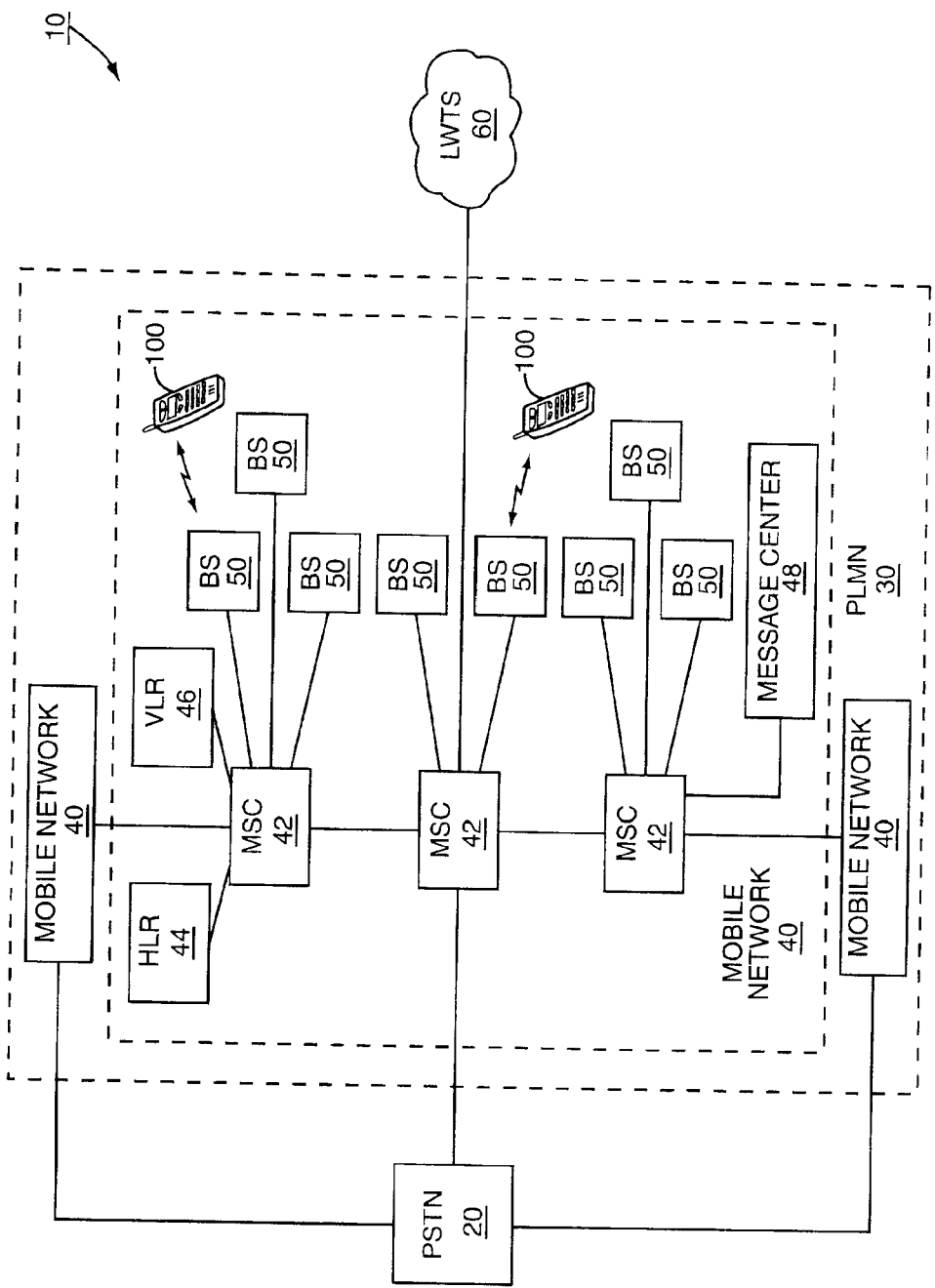
FIG. 1 illustrates a wireless communication system.

Turning now to FIG. 1, a communication system 10 is illustrated. In particular, the communications system 10 includes the Public Switched Telephone Network (PSTN) 20 and the Public Land Mobile Network (PLMN) 30, which may, in turn, be connected to one or more Localized Wireless Telephone Systems (LWTS, only one shown) 60. LWTS 60 may be proprietary or public as needed or desired. While not shown, satellites may be used as needed either within the PSTN 20 or the PLMN 30 to provide remote communication links, such as across oceans or the like.

The operation of the PSTN 20 is well established and subject to extensive documentation beyond the scope of the present invention and therefore a more detailed discussion is omitted.

PLMN 30 may include a plurality of proprietary mobile networks 40, such as those operated by AT&T and BELL-SOUTH MOBILITY, also known as service providers. Each mobile network 40 may include a plurality of Mobile Switching Centers (MSCs) 42. Note that in a TIA/EIA-136 system, MSC stands for Mobile Switching Center. Equivalently, in a GSM system, MSC stands for a Mobile Services Switching Center. The acronym and the functions remain identical, however, the term for which the acronym stands is slightly different. PDC and other systems may have yet other names, however, the general function of the MSC as herein described is intended to be embraced by the present invention. At least one MSC 42 in the PLMN 30, and more likely one MSC 42 in each mobile network 40 is connected via a gateway to the PSTN 20. Some MSCs 42 may also serve as gateways connecting the various mobile networks 40 within the PLMN 30. Gateway functions may be all consolidated at a single MSC 42 within a mobile network 40 or dispersed amongst a plurality of MSCs 42 within a mobile network 40 as needed or desired. At least one MSC 42 within a particular mobile network 40 may be communicatively connected to a Home Location Register (HLR) 44 and a Visitor Location Register (VLR) 46. Additionally, each mobile network 40 may be equipped with a message center 48 communicatively connected to an MSC 42. Each MSC 42 may further be communicatively connected to a plurality of base stations 50. An MSC 42 responsible for a LWTS 60 may treat the LWTS 60 as another base station 50 or a plurality of base stations 50 depending on the internal structure of the LWTS 60 in question. Each base station 50 may be communicatively connected to one or more mobile terminals 100, typically over an RF communications channel.

The function of the MSCs 42 is to route calls and signals in the mobile network 40 to the appropriate destination. To perform this function, a mobile network 40 relies on the HLR 44 and the VLR 46. HLR 44 is used to store information concerning subscribers to a mobile network 40 e.g. AT&T's subscribers. This information typically includes the subscriber's name and address for billing purposes, the serial number of the subscriber's mobile terminal 100, and the services that the subscriber is entitled to receive. In addition, the current coarse location of the subscriber, as evidenced by the current location of their mobile terminal 100, is stored in the HLR 44. A current coarse location is limited to identifying a cell in which the mobile terminal 100 is located which may have a resolution of approximately three hundred meters to thirty kilometers.

The current coarse location of the subscriber is secured when the mobile terminal 100 is powered on and at periodic intervals thereafter. In particular, the mobile terminal 100 registers through the nearest base station 50 with an MSC 42. This is referred to herein as the "serving MSC." The serving MSC 42 then sends information to the HLR 44 indicating in which cell of the mobile network 40 the mobile terminal 100 may be found. This assumes that the subscriber is in his home network—i.e., the one in which he has a service contract.

Mobile terminal 100 also registers through the nearest base station 50, and hence with an MSC 42, when it travels between two different service areas (areas served by different MSCs 42). As part of this registration procedure, the mobile terminal 100 transmits its Mobile Identification Number (MIN) to the closest base station 50, which in turn passes the information to the appropriate MSC 42. MSC 42 uses the MIN to determine which HLR 44 to access. When the mobile terminal 100 registers with the new MSC 42, the new serving MSC 42 updates the HLR 44 with the current location of the mobile terminal 100. When an MSC 42 receives a call addressed to a subscriber that is not currently in that MSC's service area, the MSC 42 will query the HLR 44 for the subscriber's current location so that the call can be forwarded to the MSC 42 currently serving the subscriber.

VLR 46 is used to store information about subscribers of mobile terminals 100 that are not in their home network. When subscribers roam outside of their home network, the VLR 46 in the mobile network 40 being visited must keep track of the subscriber's location and be able to verify the Mobile Identification Number (MIN) of the mobile terminal 100. VLR 46 in the network being visited queries the HLR 44 in the subscriber's home service area to authenticate the subscriber and determine the services to which the subscriber is entitled. Information concerning the subscriber is stored in the VLR 46 as long as the subscriber remains registered in the visited network. VLR 46 also stores the current location of the subscriber. The subscriber's current location is communicated back to the home network HLR 44 so that the home mobile network 40 will know where to forward a call addressed to the subscriber who is currently outside the home mobile network 40.

Together, the HLR 44 and the VLR 46 provide the information needed by the MSCs 42 to route calls to the appropriate destination. The routing may further be accomplished by handing the call to another mobile network 40, locating the appropriate base station 50, or passing the call to the PSTN 20 as is appropriate. The exact protocols and communication regimens between the various entities in a mobile network 40 are well documented, such as in TIA/EIA-136, GSM, PDC, or the like previously incorporated by reference.

Many mobile networks 40 implement a service called short message service (SMS). This service allows subscribers to send and receive short text messages. Messages originating from, or terminating at, a mobile terminal 100 in the network 40 are stored in the message center 48 connected to an MSC 42. Message centers 48 are well understood in the art and a further discussion is omitted.

Mobile terminals 100, while part of the communication system 10 are not central to the present invention and are well understood. It should be appreciated that the term mobile terminal may include a cellular radiotelephone with or without a multi-line display; a Personal Communications System (PCS) terminal that may combine a cellular radiotelephone with data processing, facsimile and data communications capabilities; a PDA that can include a radiotelephone, pager, Internet/intranet access, Web browser, organizer, calendar and/or a global positioning system (GPS) receiver; and a conventional laptop and/or palmtop receiver or other appliance that includes a radiotelephone transceiver. Mobile terminals may also be referred to as "pervasive computing" devices.

LWTS 60 may be public or proprietary as needed or desired, and is typically a private network installed in a building or on a campus. LWTS 60 allows employees or other persons working in the building or on the campus to use a mobile terminal 100 as an office telephone. LWTS 60 connects with an MSC 42 in the PLMN 30. Thus, subscribers of the LWTS 60 may move seamlessly between the PLMN 30 and the LWTS 60.

Figure 2:
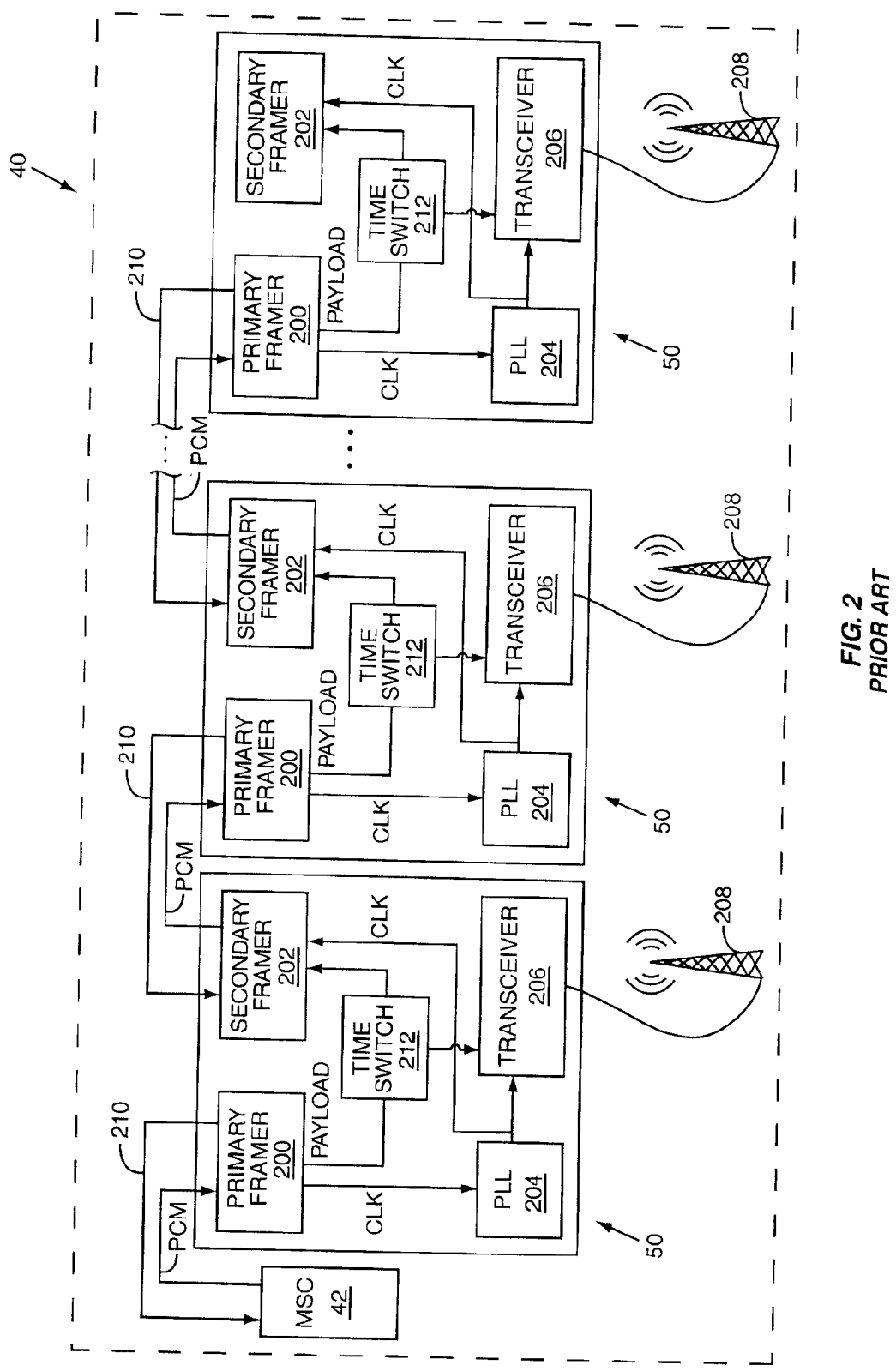
FIG. 2 illustrates an exemplary prior art system of serially cascaded base stations.

In the past, as illustrated in FIG. 2, a mobile network 40 may include an MSC 42 that has a plurality of serially cascaded base stations 50 connected by a communication link 210. Each base station 50 comprises a primary framer 200, a secondary framer 202, a phase locked loop (PLL) 204, a transceiver 206, a time switch 212 and an antenna 208.

Communication link 210 may be a PCM link such as a T1 or E1 line and may comprise an incoming and outgoing twisted pair of wires. As such, there is no dedicated clock line on such a PCM link. Ti lines typically have an F bit and twenty-four time slots, each time slot containing part of the payload. The F bit may include frame synchronization information, cyclic redundancy check information, alarms, and the like as is well understood. An E1 line may comprise thirty-two time slots, with a zero time slot dedicated to synchronization information, alarms, error checks, and the like as is well understood. For cellular communication, it is required that an accuracy of 0.016 ppm, or Stratum 2, be achieved. Where the communication link 210 is a leased PCM link, as is common, a central office (not shown) of the company owning the leased line frequently has a highly accurate, or Stratum 1 (0.01 ppb) clock signal embedded into the signal sent over the communication link 210.

Primary framer 200 comprises a line interface circuit and an extractor (neither shown) as is conventional. Primary framer 200 receives a PCM signal from the communication link 210. It is known to extract a clock signal from the signal on the communication link 210 with the primary framer 200. There may be some small amount of jitter in the signal, but it has long-term stability. Further, the primary framer 200 extracts the payload from the communication link 210. Thus, the primary framer 200 outputs a clock signal that is directed to a Phase Locked Loop (PLL) 204 and a payload signal that is directed to the time switch 212.

Phase locked loop 204 uses the clock signal from the primary framer 200 to generate a phase locked output signal. PLL 204 phase locks and settles on a desired output frequency that is used by the transceiver 206 for signal transmission and reception. PLL 204 also outputs a signal that is used by the secondary framer 202 as the clock signal.

Time switch 212 acts to shift and split the payload signal. This is done to avoid having to address each base station 50 individually. Thus, each base station 50 may extract the payload from the first time slot and shift each time slot left by one. The extracted payload signal is directed to the transceiver 206 and the shifted payload signal is directed to the secondary framer 202.

Upon receipt of the payload signal from the time switch 212 and a suitable clock signal from the PLL 204, the secondary framer 202 then outputs a PCM signal on the communication link 210. This process repeats in each of the base stations 50. It should be noted that this situation is also essentially true for serially cascaded radio heads, and a discussion thereof is not provided.

Figure 3:
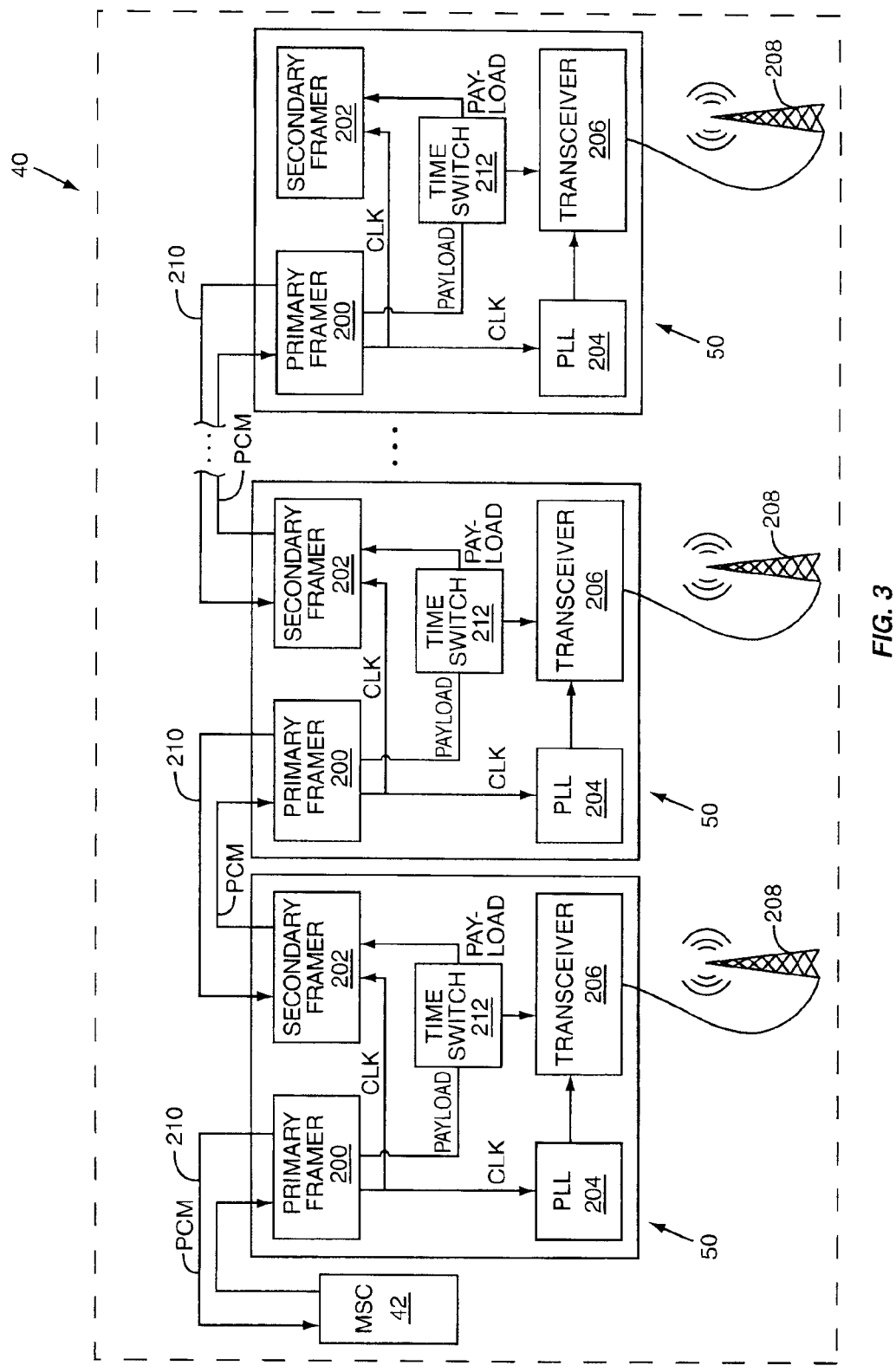
FIG. 3 illustrates a schematic view of a system of parallel cascaded base stations according to a first embodiment of the present invention.
Figure 4:
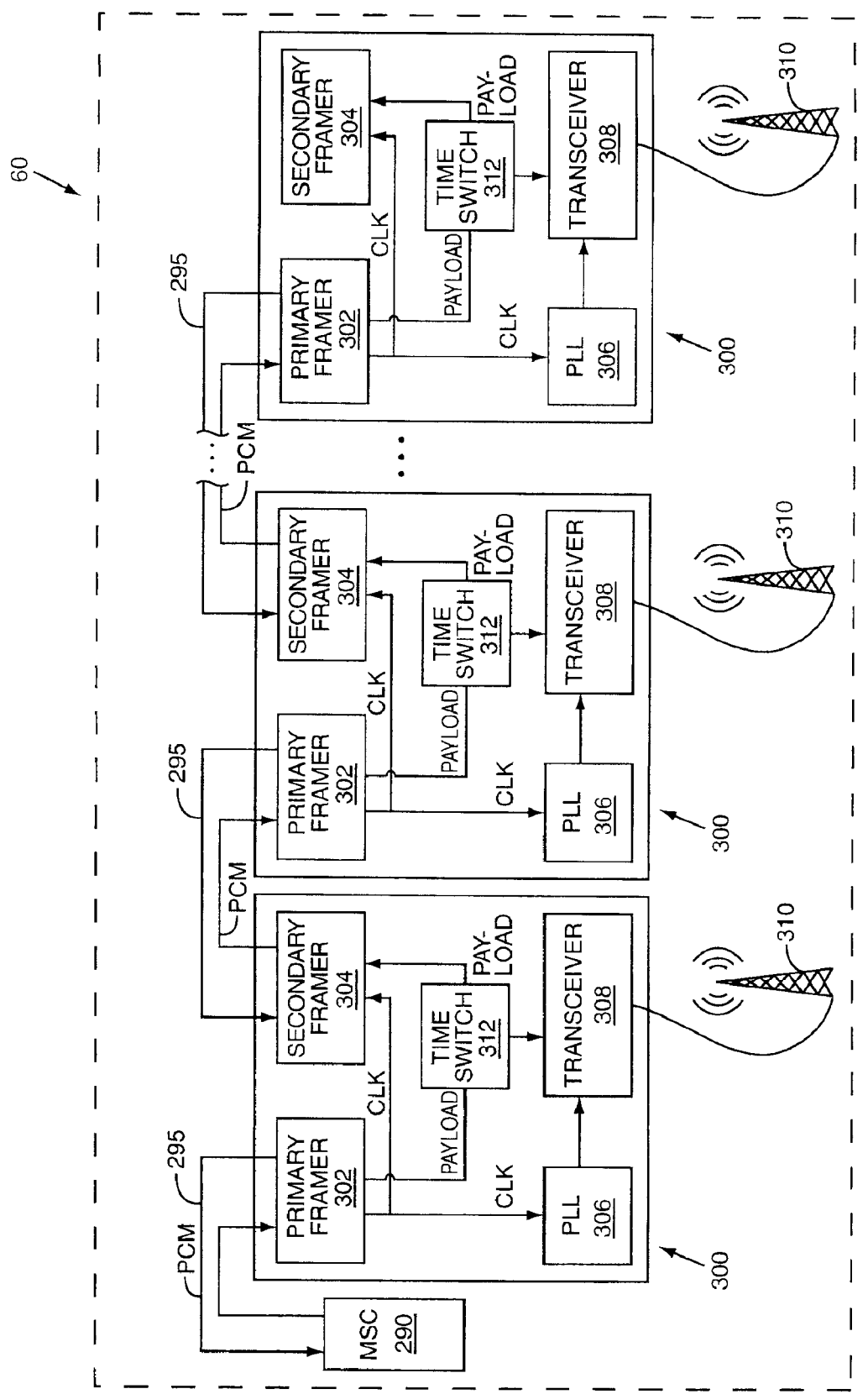
FIG. 4 illustrates a system of parallel-cascaded radio heads according to a second embodiment of the present invention.

The present invention changes the base stations 50 or radio heads from a serially cascaded arrangement such as described to a parallel-cascaded arrangement as better seen in FIGS. 3 and 4. Whereas the prior art introduced delays and errors as each PLL 204 received the clock signal and locked onto the desired frequency, the present invention reduces delays and maintains the accuracy at close to Stratum 1 levels by not directing the signal through the PLLs 204 before it reaches a downstream base station 50.

A first embodiment is illustrated in FIG. 3. In particular, cascaded base stations 50 are illustrated. Many of the elements remain the same as the prior art, however, instead of directing the clock signal through the PLL 204 and then to the secondary framer 202, the present invention splits the clock signal, directing a first clock signal for use in the PLL 204 and the second clock signal to the secondary framer 202. The payload signal is likewise split in the time switch 212, sending a first payload signal to the transceiver 206 for transmission from the antenna 208 and a second payload signal to the secondary framer 202. PLL 204 generates an output signal that is used in the transceiver 206 as is conventional.

A second embodiment is well suited for use in LWTS 60, as is illustrated in FIG. 4. LWTS 60 may include a control radio interface 290 connected to a plurality of radio heads 300 by a communication link 295. Radio heads 300 are quite similar to base stations 50; however, in radio heads, the control is centralized with distributed transceivers, whereas each base station has both a control function and a transceiver. Radio heads are sometimes referred to as pico-base stations. Radio heads 300 comprise a primary framer 302, a secondary framer 304, a PLL 306, a transceiver 308, a time switch 312, and an antenna 310.

Communication link 295 may be identical to communication link 210 and a further discussion is omitted. Primary framer 302 comprises a line interface circuit and an extractor (neither shown) as is conventional. It is known to extract a clock signal from the signal on the communication link 295 with the primary framer 302. There may be some small amount of jitter in the signal, but it has long-term stability. Further, the primary framer 302 extracts the payload from the communication link 295. In the present invention, the clock signal is split and directed to the secondary framer 304 and the phase locked loop 306. Likewise, the payload signal is split and shifted in the time switch 312 and then directed to the transceiver 308 for transmission through the antenna 310 and the secondary framer 204 for reinsertion on to the communication link 295.

Phase locked loop 306 uses the reference signal to generate intermediate frequencies which are used by the transceiver 308 to shift frequencies up to a transmit frequency and shift received frequencies down to a baseband for processing.

Secondary framer 304 receives the clock and payload signals from the time switch 312 and reinserts a combined signal onto the communication link 295.

In short, the present invention allows a local base station 50 or radio head 300 to pass a signal to a remote base station 50 or radio head 300 without the need to pass through a PLL, settle and be reintroduced to the communication link. This shortens the start up time to use the system and reduces the amount of error that may exist in the signal.

The present invention may, of course, be carried out in other specific ways than those herein set forth without departing from the scope and the essential characteristics of the invention. The present embodiments are therefore to be construed in all aspects as illustrative and not restrictive and all changes coming within the meaning and equivalency range of the appended claims are intended to be embraced therein.

What is claimed is:

1. A method of controlling a system comprising a plurality of phase locked loops, said method comprising:
   receiving a signal comprising an embedded clock signal therein;
   extracting the embedded clock signal to form an extracted clock signal;
   splitting said extracted clock signal into a first clock signal and a second clock signal;
   feeding said first clock signal to a phase locked loop for use in a transceiver; and
   passing said second clock signal to a remote location.

2. The method of claim 1 wherein receiving a signal comprising an embedded clock signal comprises receiving a signal at a base station.

3. The method of claim 1 wherein receiving a signal comprising an embedded clock signal comprises receiving a signal at a radio head.

4. The method of claim 1 wherein receiving a signal comprising an embedded clock signal comprises receiving a signal over a PCM link.

5. The method of claim 4 wherein receiving a signal over a PCM link comprises receiving a signal over a T1 line.

6. The method of claim 4 wherein receiving a signal over a PCM link comprises receiving a signal over an E1 line.

7. The method of claim 1 wherein receiving a signal comprising an embedded clock signal comprises receiving a signal at a primary framer.

8. The method of claim 7 wherein passing said second clock signal to a remote location comprises passing said second clock signal from a secondary framer to a remote location.

9. The method of claim 1 wherein passing said second clock signal to a remote location comprises passing said second clock signal to a remote base station.

10. The method of claim 1 wherein passing said second clock signal to a remote location comprises passing said second clock signal to a remote radio head.

11. The method of claim 1 further comprising splitting a payload signal in a time switch.

12. A communication system comprising:
   a plurality of communication stations, each comprising:
      a transceiver; and
      a phase locked loop associated with said transceiver;
   a communication link communicatively coupling each of said plurality of communication stations;
   wherein a first of said plurality of communication stations receives a signal comprising an embedded clock signal, extracts said embedded clock signal, forming an extracted clock signal, splits said extracted clock signal into a first clock signal and a second clock signal, passes said first clock signal to said phase locked loop and passes said second clock signal to a second of said plurality of communication stations.

13. The communication system of claim 12 wherein said first communication station comprises a first base station.

14. The communication system of claim 13 wherein said first base station comprises a primary framer that receives said signal.

15. The communication system of claim 14 wherein said first base station comprises a secondary framer that passes said second clock signal to the second of said plurality of communication stations.

16. The communication system of claim 12 wherein said first communication station comprises a first radio head.

17. The communication system of claim 16 wherein said first radio head comprises a primary framer that receives said signal.

18. The communication system of claim 17 wherein said first radio head comprises a secondary framer that passes said second clock signal to the second of said plurality of communication stations.

19. The communication system of claim 12 wherein said communication link comprises a PCM link.

20. The communication system of claim 19 wherein said communication link is selected from the group consisting of: a T1 line and an E1 line.

21. A mobile network comprising:
   at least a first and second cascaded base stations communicatively coupled by a PCM link, said first base station comprising:
      a primary framer that receives an incoming signal from a PCM link from an MSC;
      a phase locked loop;
      a time switch;
      a transceiver for wireless communication with one or more mobile terminals; and
      a secondary framer;
      said primary framer extracting a clock signal from said incoming signal and passing said clock signal to said phase locked loop for use by said transceiver, said time switch receiving a payload signal and splitting said payload signal, said secondary framer receiving one of said payload signals from the time switch and a clock signal from said primary framer and passing said payload and said clock signals to said second base station.

22. A localized wireless telephone system network comprising:
   at least a first and second cascaded radio heads communicatively coupled by a PCM link, said first radio head comprising:
      a primary framer that receives an incoming signal from a PCM link from an control radio interface;
      a time switch;
      a phase locked loop;
      a transceiver for wireless communication with one or more mobile terminals; and
      a secondary framer;
      said primary framer extracting a clock signal from said incoming signal and passing said clock signal to said phase locked loop for use by said transceiver, said time switch receiving a payload signal and splitting said payload signal, said secondary framer receiving one of said payload signals from said time switch and a clock signal from said primary framer and passing said clock signal and said payload signal to said second radio head.

* * * * *